United States Patent [19]

Yamazaki

[11] Patent Number: 4,808,554
[45] Date of Patent: Feb. 28, 1989

[54] SEMICONDUCTOR DEVICE MANUFACTURING METHOD

[75] Inventor: Shunpei Yamazaki, Tokyo, Japan

[73] Assignee: Semiconductor Energy Laboratory, Kanagawa, Japan

[21] Appl. No.: 118,893

[22] Filed: Nov. 10, 1987

Related U.S. Application Data

[62] Division of Ser. No. 929,449, Nov. 12, 1986, abandoned.

[30] Foreign Application Priority Data

Nov. 12, 1985 [JP] Japan ............... 60-253299
Nov. 18, 1985 [JP] Japan ............... 60-259194

[51] Int. Cl.$^4$ ........................... H01L 21/203
[52] U.S. Cl. ........................... 437/101; 437/105; 437/4; 427/39; 427/45.1; 427/47; 427/74; 136/258
[58] Field of Search ............ 437/2, 4, 5, 100, 101; 427/38, 39, 45.1, 47, 74; 136/258 A M

[56] References Cited

U.S. PATENT DOCUMENTS 4,532,199 7/1985 Ueno et al. ............ 430/128
4,568,626 2/1986 Ogawa ............ 430/128

FOREIGN PATENT DOCUMENTS 57-66625 4/1982 Japan ............ 136/258 A M

Primary Examiner—Aaron Weisstuch
Attorney, Agent, or Firm—Gerald J. Ferguson, Jr.

[57] ABSTRACT

An improved semiconductor device manufacturing system and method is shown. In the system, undesirable sputtering effect can be averted by virtue of a combination of an ECR system and a CVD system. Prior to the deposition according to the above combination, a sublayer can be pre-formed on a substrate in a reaction chamber and transported to another chamber in which deposition is made according to the combination without making contact with air, so that a junction thus formed has good characteristics.

16 Claims, 2 Drawing Sheets

SEMICONDUCTOR DEVICE MANUFACTURING METHOD

This is a divisional application of Ser. No. 929,449, filed Nov. 12, 1986, now abandoned.

BACKGROUND OF THE INVENTION

This invention relates to a semiconductor device manufacturing method and system, and more particularly, to a semiconductor manufacturing process with a multi-chamber system.

There has been known a plasma CVD system in which reactant gas is activated by glow discharge alone. The known process is considered advantageous compared with conventional thermal CVD system in that a deposition process can be carried out at a relatively low temperature. Further, the deposited layer thus formed contains hydrogen or halogen as a recombination neutralizer, which can impart an improved p-n, n-i or p-i junction to the layer.

Such a glow discharge CVD system, however, has only a very low deposition speed which is required to be increased by a factor of 10 to 500 for commercial applicability.

On the other hand, a CVD system enhanced by ECR is also known in which a deposition process is carried out at a pressure lower than $1 \times 10^{-2}$ torr, e.g., $1 \times 10^{-2}$ to $1 \times 10^{-5}$ torr. According to this method and system, a 5000 Å to 10 microns thick layer can be deposited at a rate of 10 to 100 A/sec. However, when a plurality of layers are desired to be deposited, it requires a substantially longer time.

SUMMARY OF THE INVENTION

It is therefore an object of the invention to provide a semiconductor manufacturing method and system capable of producing a semiconductor device with a high quality junction.

It is therefore another object of the invention to provide a semiconductor manufacturing method and system capable of yielding large throughput.

It is therefore a further object of the invention to provide a semiconductor manufacturing method and system with a short processing time.

DETAILED DESCRIPTION OF THE PREFERRED EMBODIMENT

According to the invention, nonreactive gas such as argon gas is energized by electron cyclotron resonance. The active nonreactive gas can transfer a part of its energy to a reactive gas which is decomposed in a glow discharge CVD system, so that an intrinsic layer can be deposited without a sputtering effect on a sub-layer (an impurity doped semiconductor layer) which has been already formed on a substrate. Namely, the tendency of the glow discharge CVD method to injure a substrate by its sputtering effect is largely alleviated.

Depositions are carried out in a multi-chamber system in which a plurality of depositions are made in succession without the substrate making contact with air. As a result, junctions are prevented from contamination and from incurring lower oxide or lower nitride formation.

Further, combination of an ECR system and a glow discharge CVD system makes it possible to perform depositions at high speed and with the product having high quality.

The deposition is made at low pressures, e.g. $10^{-5}$ to $10^{-2}$, preferably $10^{-4}$ to $10^{-3}$ torr, which are very low in comparison with the pressures used in the prior art, e.g. about 0.1 to 0.5 torr. The low pressure reduces the residual gas retained in the chamber which contaminates the next deposition process, making it possible to streamline manufacturing processes including a plurality of deposition processes by dispensing with conventional steps of evacuating the chambers sufficiently and then opening a valve partitioning the chambers before the actual deposition step.

As a reactant gas, a silicide gas such as $Si_nH_{2n+1}$ ($n \geq 1$), $SiF_n$ ($n \geq 2$), $SiH_nF_{4-n}$ ($1 < n < 4$) or $Si(CH_3)_nH_{4-n}$ ($n = 1,2,3$), a germanium compound such as $GeH_4$, $GeF_4$ or $GeH_nF_{4-n}$ ($n = 1,2,3$), or a tin compound such as $S_nCl_4$, $S_nF_2$ or $S_nF_4$ can be employed.

In addition to this, a doping gas may be added as an additive, such as $B_2H_6$, $BF_3$, or $PH_3$, to fabricate an impurity doped semiconductor layer.

Figure 1:
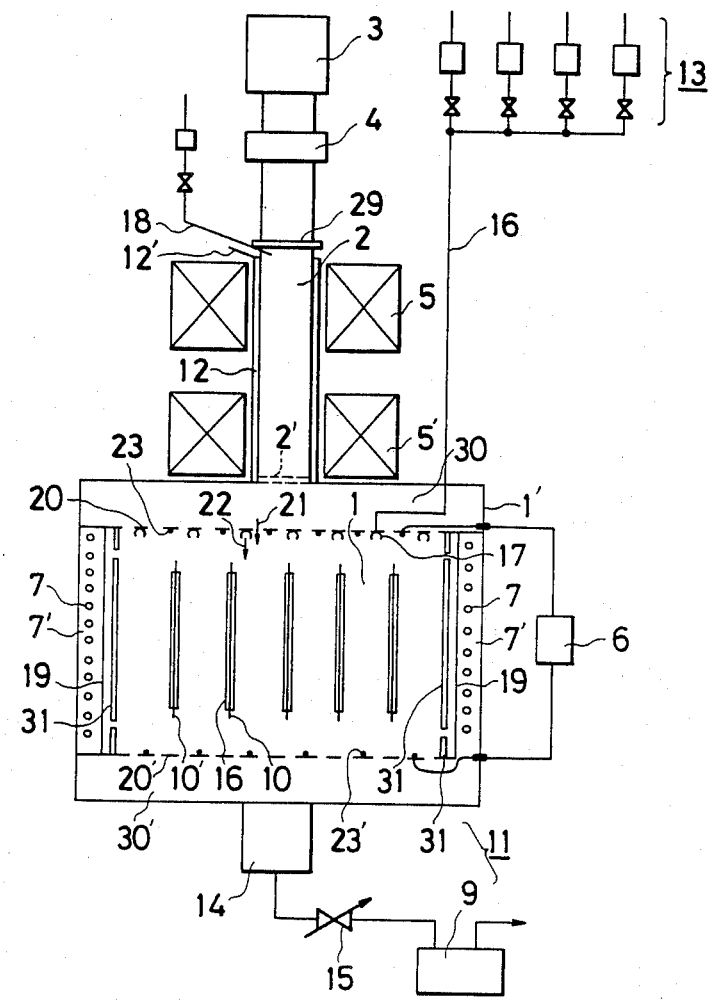
FIG. 1 is a cross section view of an ECR enhanced CVD system.

Referring now to FIG. 1, a plasma enhanced CVD system employed in a system according to the invention is shown. A reaction chamber 1 is accompanied, although not shown in the figure, with a loading chamber and an unloading chamber on the opposite sides of the reaction chamber 1, perpendicular to the plane of the paper. The reaction chamber and the loading and unloading chambers communicate with each other through gate valves. Between the loading and unloading chambers, a reaction space is surrounded by collars 31 and 31' made of stainless steel and/or an insulator so that excited reactant gas does not spread out to the inside of the structure and does not accumulate the product which can cause flakes to be present in a thus deposited layer. The collar 31 is formed with five substrate holders 10' and is capable of being removed from the reaction chamber 1 shown in the figure On both sides of each holder 10' are fixed substrates 1f. With the reaction space therebetween, halogen lamp heaters 7 are provided to irradiate the collar 31 and the substrates on the holders 10' with infrared light. The pair of collars 31' are formed and arranged to constitute an enclosure in cooperation with the collar 31, the three collars being made flush with each other. Further, a pair of meshed grids 20 and 20' are provided at the upper side and lower side of the reaction space 1. A glow discharge takes place by applying to the grids 20 and 20' an alternating electric field of 13.56 MHz or a direct electric field by means of power supply 6.

Above the reaction chamber, a resonating space is formed as the inside space of a resonance chamber 2. Non-reactive gas is introduced into the reaction space through conduit line 18. The resonance space is subjected to a magnetic field by energizing core-less coil 5, 5', a Helmholtz coil 5, 5' surrounding the resonating space in this embodiment. A cooling circuit 12, 12' is arranged around the resonance chamber 2. Further, microwaves are radiated into the resonance space from a microwave oscillator 3 via an isolator 4 through a window made of synthetic quartz. Argon gas as a non-reactive gas is introduced and excited in the resonance space. The magnitude of the magnetic field is chosen at 875 Gauss in this case. The magnitude of the magnetic field and the frequency of the microwaves are in general determined according to the molecular weight of the non-reactive gas to be excited.

In this manner, the argon gas thus excited is pinched by the magnetic field and is in a resonance with the microwaves in the presence of a magnetic field. The excited argon gas is introduced to the reaction space 1 through extraction grids 2'. Between the grids 2 and the resonance space space are a buffer space 30 and a plurality of nozzles 23 through which reactant gas is introduced throughout the reaction space. The reactant gas is mixed with the excited non-reactant gas and is excited by transferring energy from the non-reactant gas. The mesh electrodes 20 also function as a homogenizer to prevent the excited gas from back-flowing. In the case where the collars are made from an insulator, a pair of insulator grids are used as a homogenizer and a plurality of electrodes are provided to produce electron discharge.

As a result, electrons and the excited gas 21 spread throughout the reaction chamber. Even with the substantial distance between the resonance space and the surfaces of the substrates, the excited energy states of the reactant gas derived from the non-reactive resonance gas remain in the vicinity of the substrates. When cyclotron resonance is used alone as in the prior art, the distance has been chosen to be about 5 to 15 cm. While a short distance between the resonance space and the substrates reduces the loss of energy of the excited gas, it has made the deposited layer uneven.

Further, in order to spread the reaction gas throughout the reaction chamber 1 and establish cyclotron resonance, the pressure in the resonance space and the reaction space is chosen at $1 \times 10^{-3}$ to $1 \times 10^{-4}$ torr, $3 \times 10^{-4}$ for example. The pressure is adjusted by controlling the exhausting rate of vacuum pump 9 by means of control valve 15 in cooperation with a turbo pump 14.

EXPERIMENT 1

This experiment was conducted in order to fabricate an amorphous silicon layer according to the above described system.

Namely, the experiment employed a reaction chamber 40 cm in height and 50 cm in width and length in which is formed a reaction space 30 cm in height and 35 cm in width and length. Ten substrates 10 were placed on the holder 31. Argon gas was introduced as a non-reactive gas into the reaction space 1 under a pressure $3 \times 10^{-4}$ torr, through the line 18 at a rate of 200 cc/min. Monosilane gas was introduced through the line 16 at a rate of 80 cc/min. In addition to this, $B_2H_6$ gas diluted with $SiH_4$ to a concentration of 0.1 to 10 ppm may be leaked simultaneously to make a substantially intrinsic semiconductor, if desired. An initial high-frequency electric power of 40 W was supplied from the power source 6. Also supplied was microwave energy at a frequency of 2.45 GHz at a power of 200 W to 800W, preferably 400 W. The magnitude of the magnetic field was chosen at $875 \pm 100$ Gauss.

The substrates 10 were provided with a transparent conductive layer. A non-monocrystal semiconductor layer, for example, an amorphous silicon semiconductor was deposited thereon at a substrate temperature of 250° C., while exhausting unnecessary gas through the exhaust system 11. The deposition speed was 45 Å/sec. This deposition speed is 30 times larger than that obtained with a plasma CVD system alone, i.e. 1.5 Å/sec.

A dark conductivity of $4 \times 10^{-10}$ Scm$^{-1}$ and a photo conductivity of $6 \times 10^{-5}$ Scm$^{-1}$ (AM:100mW/cm$^2$) were obtained as electric characteristics of the deposited amorphous silicon layer which was devoid of dopant. These conductivities are equivalent to those obtained by a plasma CVD deposition system. A high conversion efficiency is expected also in the case where a solar cell is manufactured with a p-i-n junction, the i-layer being fabricated according to the method of this experiment.

EXPERIMENT 2

This experiment was made to demonstrate deposition of a non-monosemiconductor, $Si_xC_{1-x}$ ($0<X<1$) of p-type. The preparation conditions for this experiment are largely the same as in the previous experiment so that only differences are described in the following.

As a reactant gas, a gas composed of $H_2Si(CH_3)_2/SiH_4 = 1/7$ and a gas composed of $B_2H_6/SiH_4 = 5/1000$ were introduced into the reaction space 1. The output power of the microwave oscillator 3 was 300 W. The substrate temperature was kept at 180° C. at a pressure of $3 \times 10^{-4}$ torr. As a result, an optical energy gap of 2.4 eV and a dark conductivity of $3 \times 10^{-6}$ Scm$^{-1}$ were obtained.

EXPERIMENT 3

This experiment was made to demonstrate deposition of a microcrystalline semiconductor of n-type. Only deviations from Experiment 1 are described for this experiment.

Namely, the reactant gas was introduced as $SiH_4/H_2 = 1/5$ to $1/40$, preferably $1/30$ at a pressure of $3 \times 10^{-4}$ torr. The output power of the microwave oscillator was 400 W. The substrate temperature was 250° C. As a result, an optical energy gap of 1.65 eV and an electric conductivity of 50 Scm$^{-1}$ were obtained.

Because the ECR system has no sputtering effect even at a high microwave power, the average crystallite size tends to increase thereby rendering the deposited layer more polycrystallized. The crystallization rate is increased to 70% while the rate is only 50% according to a glow discharge plasma CVD system. Further, the semiconductor layer thus formed according to the experiment had a finely textured microcrystallite structure even with the reaction gas of $SiH_4/H_2 = 1/5$ to $1/40$.

EXPERIMENT 4

In this embodiment, a $SiO_{2-x}$ ($0<X<2$) or $Si_3N_{4-x}$ ($0<X<4$) layer was deposited in the same basic manner as described in Experiment 1.

Oxygen gas and nitrogen gas were introduced into the resonance space together with argon gas. $SiH_4$ gas was introduced into the reaction chamber 1 through the line 16. The ratio of the introduced oxygen gas or nitrogen gas to the introduced $SiH_4$ determines the value of X. When X=0 was desired corresponding to $SiO_2$ or $Si_3N_4$, an equivalent amount of oxygen gas or nitrogen gas to $SiH_4$ was introduced.

Figure 2:
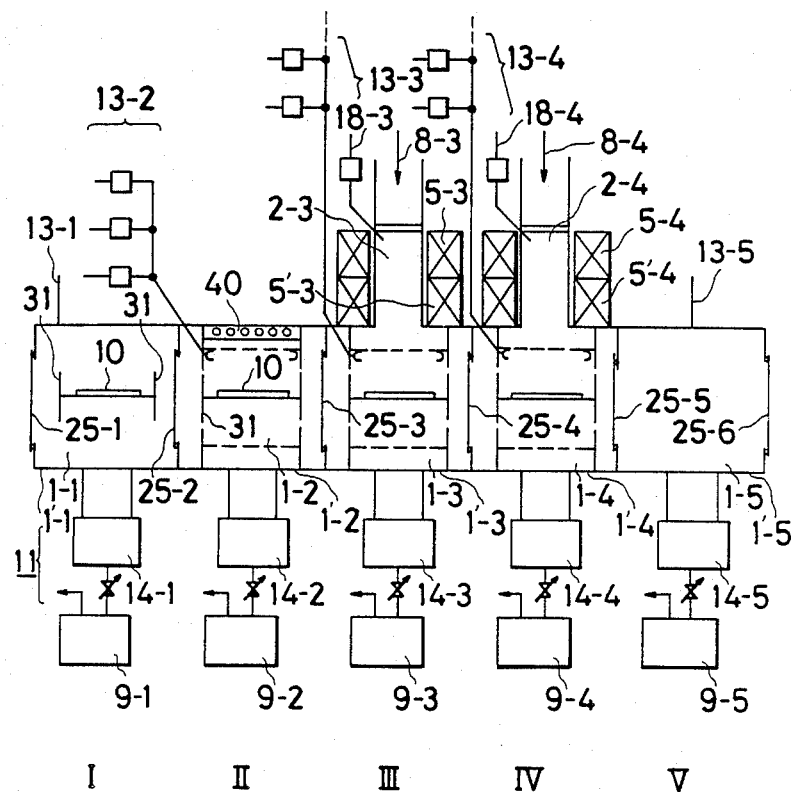
FIG. 2 is a cross section view showing an embodiment of the invention.

Referring now to FIG. 2, another embodiment of the invention is shown. An object of this embodiment is to fabricate a semiconductor layer with a p-i-n junction or an n-i-p junction by means of a multi-chamber system.

The multi-chamber system is comprised of five sections. The first section I is a loading chamber 1'-1. The second section II is a second chamber 1'-2, to deposit, for example, p-type layers. The third section III is a third chamber 1'-3, to deposit, for example, i-type layers. The fourth section IV is a fourth chamber 1'-4 to deposit, for example, n-type layers. The fifth section V is an unloading chamber 1'-5. For producing an n-i-p junction, sections II and IV be interchanged.

Each chamber is provided with a gas feeding system 13-1, 13-2, ... or 13-5 and an exhausting system 11 equipped with a turbo molecular pump 14-1, 14-2, ... or 14-5 and a vacuum pump 9-1, 9-2, ... or 9-5. Each chamber of the intermediate three chambers includes a reaction space 1-2, 1-3 or 1-4, respectively. The second section II is a photo CVD system which is equipped with a mercury lamp 40 and halogen lamps disposed in opposed relations respective to the direction perpendicular to the plane of the drawing with the reaction chamber in between. The third and fourth sections are ECR enhanced CVD systems each of which is configured the same as in FIG. 1 and equipped with a Helmholtz coil 5-3 or 5-4 and a microwave oscillator not shown in the figure. Although argon gas is employed as a resonance gas, hydrogen gas may be used. In the case of hydrogen gas, the magnitude of magnetic field has to be increased inversely proportional to the molecular weight.

A gate valve 25-2, 25-3, ... or 25-5 is disposed between each pair of adjacent chambers. The substrate holder 31 is transported from one chamber to another with the appropriate gate valve opened. During deposition, of course, the valve is kept closed. The entrance valve 25-1 and the exit valve 25-6 are, however, opened during deposition to furnish a new substrate on the holder in the loading chamber 1'-1 and to remove the substrate which has been deposited on in the chambers 1'-2, 1'-3, and 1'-4.

The deposition processes in the reaction spaces 1-3 and 1-4 are carried out according to Experiment 1, Experiment 2, or Experiment 3. After completion of deposition in the reaction spaces 1-2, 1-3, and 1-4, the supply of the reactant gas and radiation of microwaves are halted and the substrate holders 31 are transported by a transportation means (not shown in the figure) to the adjacent chamber with the valves 25-1 and 25-6 closed. The transporting step is carried out swiftly without exhausting the gas inside of each chamber. The resonance gas, e.g. argon gas, may or may not be continuously introduced. After the transport is completed, the next deposition process is carried out respectively in the chambers 1'-2, 1'-3 and 1'-4 with the valves 25-2 to 25-5 closed. With the above process in mind, it is easily understood that the semiconductor thus deposited is less contaminated and oxidized at the p-i and i-n junctions compared with that formed with a prior art glow discharge plasma CVD system.

The solar cell thus formed has a conversion efficiency of 12.9%, an open circuit voltage of 0.92 V, and a short circuit current density of 18.4 mV/cm$^2$, with an effective area of 1.05 cm$^2$. Such a high conversion efficiency is possibly attributed to the fact that no sputtering by the reactive gas takes place in the ECR CVD system. Further, it can be considered as another reason for the high conversion efficiency that the pressure in the chamber during deposition is $1 \times 10^{-3}$ to $1 \times 10^{-5}$ torr, $3 \times 10^{-4}$ torr for example, which is lower than that employed by a glow discharge plasma system, impurity gas and reactive gas are exhausted by the turbo pump after deposition in a time period reduced by a factor of 100 in comparison with that required in a glow discharge CVD system.

In the embodiment, the gate valves 25-3 and 25-4 may be omitted from the system. In this case, buffer spaces are formed between the chambers to improve the productivity of the system and the adjacent chambers are substantially isolated by means of the side walls of the holder 31.

The solar cell fabricated according to this modification has a conversion efficiency of 12.6%, an open voltage of 0.93V, a short current density of 18.3 mA/cm$^2$, and a fill factor of 0.81, with an effective area of 1.05 cm$^2$. Besides cost saving, it is possible to transport the holder to the adjacent chamber within 5 minutes by dispensing with the gate valves 25-3 and 25-4, thereby increasing the throughput.

Further, according to the embodiment, only one to three pin-holes having 0.1 to 0.01 micron in diameter are observed in a dark field of a microscope with a magnification factor of 100, which is 1/10 of that observed on a layer deposited by a glow discharge method.

The invention is also advantageous when applied to a process for producing an insulated-gate FET of thin film type. In this case, the second section II is a reaction space in which is formed a semiconductor layer. The third section III is a reaction space in which is formed a silicon nitride layer. The fourth section IV is a reaction space in which is formed a silicon oxide layer. Each formation process is substantially the same as described supra.

While a description has been made for several embodiments, the present invention should be limited only by the appended claims and should not be limited by the particular examples. What follow are some examples of modifications and variation according to the invention.

A glow discharge CVD system can be employed as a first section I in the embodiment instead of the photo enhanced CVD system.

The present invention can be applied to light emitting MISs, superlattice light emitting devices, and so on. Further, the invention is advantageous for semiconductor lasers or integrated circuit optical devices.

Although the ECR system in the embodiment is equipped with a glow discharge system, a photo enhanced system can be incorporated with the ECR system. In this case, an eximer laser having a wavelength of 100 to 400 nm, an argon laser, a nitrogen laser, and so on is used as a light source.

As a reactant gas, disilane or a mixture of monosilane and Si$_2$F$_6$ may be used which is expected to further improve the deposition speed.

The substrate may be of silicon semiconductor, glass, synthetic resin, stainless steel, or one which is provided with an electrode thereon.

As a semiconductor to be deposited, Si$_x$Ge$_{1-x}$ ($0<X<1$), Si$_x$Sn$_{1-x}$ ($0<X<1$), C$_x$Ge$_{1-x}$ ($0<X<1$), or their intrinsic or impurity doped semiconductors can be used.

A substrate holder capable of holding a plurality of substrates as shown in FIG. 1 can be used for the multichamber system as shown in FIG. 2.

We claim:

1. A semiconductor device manufacturing method by chemical vapor reaction comprising the steps of:
   evacuating a vacuum chamber by evacuating means;
   introducing a non-reactive gas into a first portion of said vacuum chamber;
   subjecting said non-reactive gas to a magnetic field;
   applying microwaves to said non-reactive gas to excite said non-reactive gas and energize under the existence of said magnetic field, charged particles of said non-reactive gas;

mixing said non-reactive gas so energized with a reactive gas introduced into a second portion of said vacuum chamber to energize said reactive gas; and subjecting said reactive gas so energized to a glow discharge enhanced chemical vapor reaction of silicon and carbon, whereupon, by virtue of the dual energizing of said reactive gas, said reactive gas decomposes to deposit a $Si_xC_{1-x}$ ($0<X<1$) semiconductor layer on a substrate placed in said vacuum chamber;

wherein said chemical vapor reaction is carried out at a negative pressure which is maintained at less than $10^{-2}$–$10^{-5}$ Torr by the cooperation of a vacuum pump and a turbo molecular pump, whereby said vacuum pump operates to reduce the pressure to a level at which said turbo molecular pump then operates to reduce the pressure in said vacuum chamber to less than $10^{-2}$–$10^{-5}$ Torr.

2. The method of claim 1 wherein said reactive gas is a mixture of silane and a methyl silane.

3. The method of claim 2 wherein said methyl silane is dimethyl silane.

4. The method of claim 2 wherein said $Si_xC_{1-x}$ semiconductor is formed as a p-type semiconductor by introducing a boron compound gas as a dopant gas.

5. The method of claim 4 wherein said boron compound gas is diborane diluted with silane gas.

6. A semiconductor device manufacturing method by chemical vapor reaction comprising the steps of:

introducing a non-reactive gas into a first portion of a vacuum chamber;

subjecting said non-reactive gas to a magnetic field;

applying microwaves to said non-reactive gas to excite said non-reactive gas;

mixing said non-reactive gas so energized with a reactive gas introduced into a second portion of said vacuum chamber to energize said reactive gas; and subjecting said reactive gas so energized to a glow discharge enhanced chemical vapor reaction of silicon and carbon, whereupon, by virtue of the dual energizing of said reactive gas, said reactive gas decomposes to deposit a $Si_xC_{1-x}$ ($0<X<1$) semiconductor layer on a substrate placed in said vacuum chamber.

7. The method of claim 6 wherein said first portion of said vacuum chamber comprises a resonating space subjected to said magnetic field and receiving said microwaves, and said second portion of said vacuum chamber comprises a reaction space intercommunicating with said resonating space and holding said substrate therein.

8. The method of claim 7 wherein said reactive gas is inputted to said reaction space, and said reactive gas is mixed with said non-reactive gas excited by the microwaves and is energized by the energy of said excited non-reactive gas.

9. The method of claim 6 wherein said reactive gas contains a methyl silane.

10. The method of claim 9 wherein said methyl silane is dimethyl silane.

11. The method of claim 6 wherein said reactive gas is a mixture of a silicide gas and carbide gas.

12. The method of claim 11 wherein said $Si_xC_{1-x}$ semiconductor is formed as a p-type semiconductor by introducing a boron compound gas as a dopant gas together with said reactive gas.

13. The method of claim 12 wherein said boron compound gas is diborane gas diluted with silane gas.

14. The method of claim 6 wherein said reactive gas is a mixture of silane and a methyl silane.

15. The method of claim 8 wherein said reactive gas includes a phosphorus compound gas as a dopant gas.

16. The method of claim 6 wherein the energizing step of said non-reactive gas is carried out by electron cyclotron resonance.

* * * * *